(12) United States Patent
Strutz et al.

(10) Patent No.: US 9,741,677 B1
(45) Date of Patent: Aug. 22, 2017

(54) SEMICONDUCTOR DEVICE INCLUDING ANTISTATIC DIE ATTACH MATERIAL

(71) Applicant: Infineon Technologies AG, Neubiberg (DE)

(72) Inventors: Volker Strutz, Tegernheim (DE); Rainer Markus Schaller, Saal a.d. Donau (DE); Franz-Peter Kalz, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/057,481

(22) Filed: Mar. 1, 2016

(51) Int. Cl.
*H01L 29/82* (2006.01)
*H01L 23/00* (2006.01)
*H01L 27/22* (2006.01)

(52) U.S. Cl.
CPC .............. *H01L 24/29* (2013.01); *H01L 24/83* (2013.01); *H01L 27/22* (2013.01); *H01L 2224/2929* (2013.01); *H01L 2224/2957* (2013.01); *H01L 2224/29393* (2013.01); *H01L 2224/29499* (2013.01); *H01L 2224/29561* (2013.01); *H01L 2224/83855* (2013.01); *H01L 2924/30101* (2013.01)

(58) Field of Classification Search
USPC .................. 257/421, 678–733, 787–796, 257/E21.499–E21.519; 438/15, 26, 51, 438/55, 106, 124–127
See application file for complete search history.

(56) References Cited

U.S. PATENT DOCUMENTS

| 6,506,321 | B1 | 1/2003 | Yamashita et al. | |
|---|---|---|---|---|
| 2004/0100832 | A1* | 5/2004 | Nakajima | B82Y 10/00 365/200 |
| 2008/0070054 | A1 | 3/2008 | Sumita et al. | |
| 2009/0256255 | A1 | 10/2009 | Gektin et al. | |
| 2011/0304045 | A1 | 12/2011 | Liu et al. | |
| 2011/0304991 | A1 | 12/2011 | Huang et al. | |
| 2013/0092318 | A1 | 4/2013 | Saito et al. | |
| 2013/0234313 | A1 | 9/2013 | Wainerdi et al. | |
| 2013/0330910 | A1* | 12/2013 | Tanaka | H01L 21/6836 438/462 |
| 2014/0100832 | A1* | 4/2014 | Pado | G01M 5/0066 703/6 |
| 2014/0225193 | A1 | 8/2014 | Chu et al. | |

FOREIGN PATENT DOCUMENTS

EP 1039557 A1 9/2000

* cited by examiner

*Primary Examiner* — Tram H Nguyen
(74) *Attorney, Agent, or Firm* — Dicke, Billig & Czaja, PLLC

(57) ABSTRACT

A semiconductor device includes a substrate, a semiconductor die, and an antistatic die attach material between the substrate and the semiconductor die. The antistatic die attach material includes a mixture of a nonconductive adhesive material and carbon black or graphite. In one example, the antistatic die attach material has a resistivity between $10^1$ $\Omega\cdot cm$ and $10^{10}$ $\Omega\cdot cm$.

11 Claims, 4 Drawing Sheets

SEMICONDUCTOR DEVICE INCLUDING ANTISTATIC DIE ATTACH MATERIAL

BACKGROUND

Current sensors, current transducers, magnetic couplers, and other electromagnetic field devices may be integrated into a semiconductor device package. The devices may include galvanic isolation between the potential of an electromagnetic field generating component (e.g., integrated circuit, coil, power rail, etc.) and the potential of a sensor or other component (e.g., integrated circuit) that senses the electromagnetic field generated by the electromagnetic field generating component. The insulation strength within the semiconductor device package may be dependent upon the partial discharge robustness of the die attach layer(s) used within the semiconductor device package.

For these and other reasons, there is a need for the present invention.

SUMMARY

One example of a semiconductor device includes a substrate, a semiconductor die, and an antistatic die attach material between the substrate and the semiconductor die. The antistatic die attach material includes a mixture of a nonconductive adhesive material and carbon black or graphite.

DETAILED DESCRIPTION

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As used herein, the term "electrically coupled" is not meant to mean that the elements must be directly coupled together and intervening elements may be provided between the "electrically coupled" elements.

When a semiconductor die is attached to a substrate, the die attach material between the semiconductor die and the substrate may include voids. In semiconductor devices including galvanic isolation between components, the voids reduce the partial discharge resistance of the die attach layer(s). Accordingly, as described herein, an antistatic die attach material is used to maintain a suitable partial discharge resistance even if voids are present in the die attach material.

Figure 1:
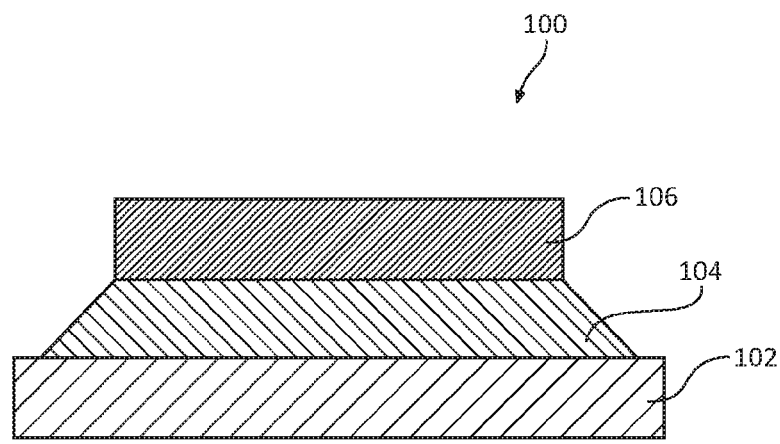
FIG. 1 is a cross-sectional view illustrating one example of a semiconductor device including an antistatic die attach material.

FIG. 1 is a cross-sectional view illustrating one example of a semiconductor device 100 including an antistatic die attach material. Semiconductor device 100 includes a substrate 102, an antistatic die attach material 104, and a semiconductor die 106. Antistatic die attach material 104 is on the upper surface of substrate 102. Semiconductor die 106 is on the upper surface of antistatic die attach material 104 to attach semiconductor die 106 to substrate 102.

In one example, substrate 102 is an insulating substrate, such as a glass substrate, a ceramic substrate, a bulk silicon substrate, or another suitable dielectric material substrate. In another example, substrate 102 is a conductive substrate, such as a leadframe or another suitable conductive substrate. Semiconductor die 106 may include a magnetic field sensor, such as a hall sensor, a magnetoresistive element (e.g., giant magnetoresistive element, tunneling magnetoresistive element), or another suitable device.

Antistatic die attach layer 104 includes a mixture of a nonconductive adhesive material and carbon black (i.e., carbon powder) or graphite (e.g., graphite flakes). The nonconductive adhesive material by itself may have a resistivity of $10^{14}$ Ω·cm. The nonconductive adhesive material may include an epoxy or another suitable nonconductive material. The carbon black or graphite is added to the nonconductive adhesive material to reduce the resistivity of the resulting antistatic die attach material to between $10^1$ Ω·cm and $10^{10}$ Ω·cm, such as $10^6$ Ω·cm. In one example, to provide the desired resistivity of the antistatic die attach material, the antistatic die attach material may include between 1% and 20% by weight of carbon black or graphite, such as between 1% and 10% by weight or between 1% and 2% by weight.

Antistatic die attach material 104 may be in the form of a die attach film (DAF), a backside coating, a dispensable glue, or another suitable form. To fabricate semiconductor device 100, the antistatic die attach material is applied to substrate 102 and/or to semiconductor die 106. Semiconductor die 106 and substrate 102 are then arranged such that the antistatic die attach material is between semiconductor die 106 and substrate 102. The antistatic die attach material may then be cured to fixedly attach semiconductor die 106 to substrate 102.

Figure 2:
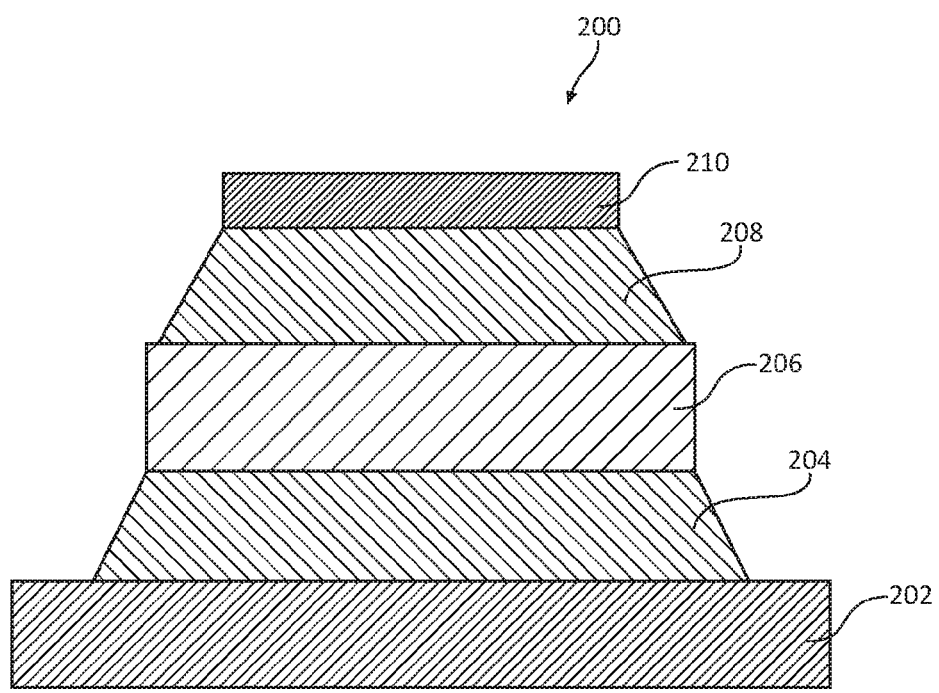
FIG. 2 is a cross-sectional view illustrating another example of a semiconductor device including an antistatic die attach material.

FIG. 2 is a cross-sectional view illustrating another example of a semiconductor device 200 including an antistatic die attach material. Semiconductor device 200 includes a substrate 202, a first antistatic die attach material 204, an isolator 206, a second antistatic die attach material 208, and a semiconductor die 210. First antistatic die attach material 204 is on the upper surface of substrate 202. Isolator 206 is on the upper surface of first antistatic die attach material 204 to attach isolator 206 to substrate 202.

Second antistatic die attach material 208 is on the upper surface of isolator 206. Semiconductor die 210 is on the upper surface of second antistatic die attach material 208 to attach semiconductor die 210 to isolator 206.

In this example, substrate 202 includes a conductive material, such as a leadframe. Isolator 206 includes glass, ceramic, bulk silicon, or other suitable insulating material. Semiconductor die 210 may include an electromagnetic field sensor to sense an electromagnetic field generated by a current passing through substrate 202. In one example, semiconductor die 210 includes a magnetic field sensor, such as a hall sensor or magnetoresistive element to sense a current through substrate 202. First antistatic die attach material 204 and second antistatic die attach material 208 is similar to antistatic die attach material 104 previously described with reference to FIG. 1.

Figure 3:
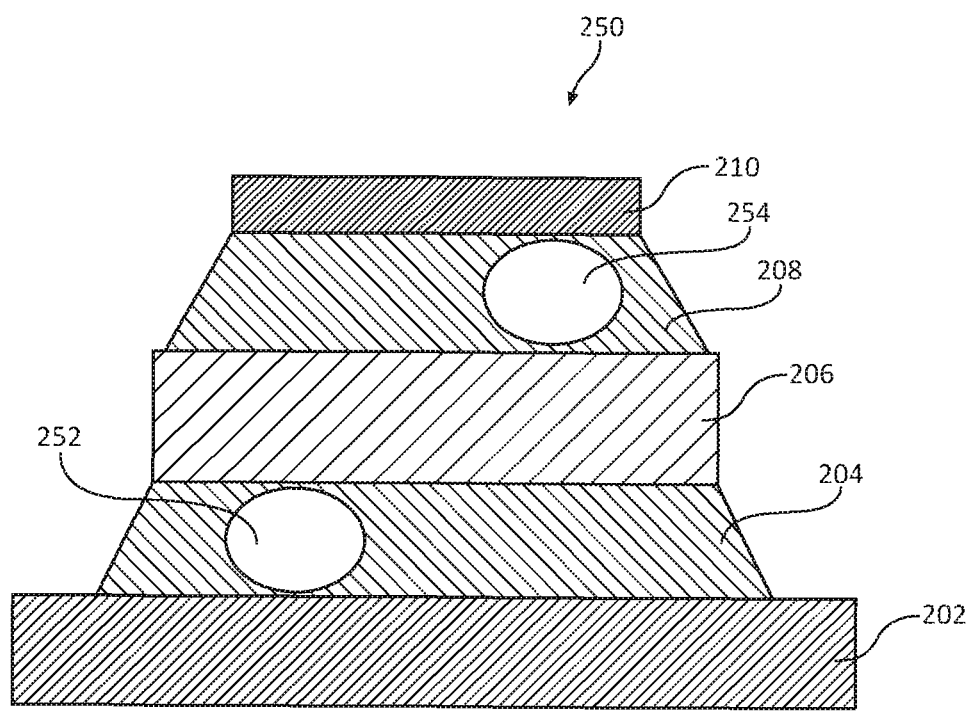
FIG. 3 is a cross-sectional view illustrating one example of the semiconductor device of FIG. 2 including voids in the antistatic die attach material.

FIG. 3 is a cross-sectional view illustrating one example of a semiconductor device 250 including voids in the antistatic die attach material. Semiconductor device 250 is similar to semiconductor device 200 previously described and illustrated with reference to FIG. 2, except that semiconductor device 250 includes a void 252 in first antistatic die attach material 204 and a void 254 in second antistatic die attach material 208. Voids 252 and 254 may be formed due to the process used to apply the antistatic die attach material.

Antistatic die attach material 204 and 208 prevents voids 252 and 254 from adversely affecting the operation of semiconductor device 250. In operation, a high potential (e.g., greater than 500V) may be applied to substrate 202 while a low potential (e.g., less than 24V) may be applied to semiconductor die 210. Isolator 206 and antistatic die attach material 204 and 208 provide galvanic isolation between semiconductor die 210 and substrate 202. Antistatic die attach material 204 and 208 prevents localized electric fields within voids 252 and 254 by enabling charges to flow through the antistatic die attach material around the voids. By using antistatic die attach material 204 and 208, voids 252 and 254 do not significantly reduce the partial discharge resistance of semiconductor device 250.

An electrically conductive adhesive material used as a die attach material, such as an adhesive material including silver or gold filler, could also prevent localized electric fields in voids 252 and 254 by acting as a Faraday cage around the voids. The high conductivity of the electrically conductive adhesive material, however, would adversely affect the operation of semiconductor device 250 since a significant bypass current would flow through the electrically conductive adhesive material instead of through the substrate. This bypass current that would flow through the electrically conductive adhesive material could affect the accuracy of the sensor provided by semiconductor die 210. Since antistatic die attach material 204 and 208 has a lower resistivity than electrically conductive adhesive materials, a negligible bypass current flows through the antistatic die attach material such that the accuracy of the sensor provided by semiconductor die 210 is not adversely affected.

Figure 4A:
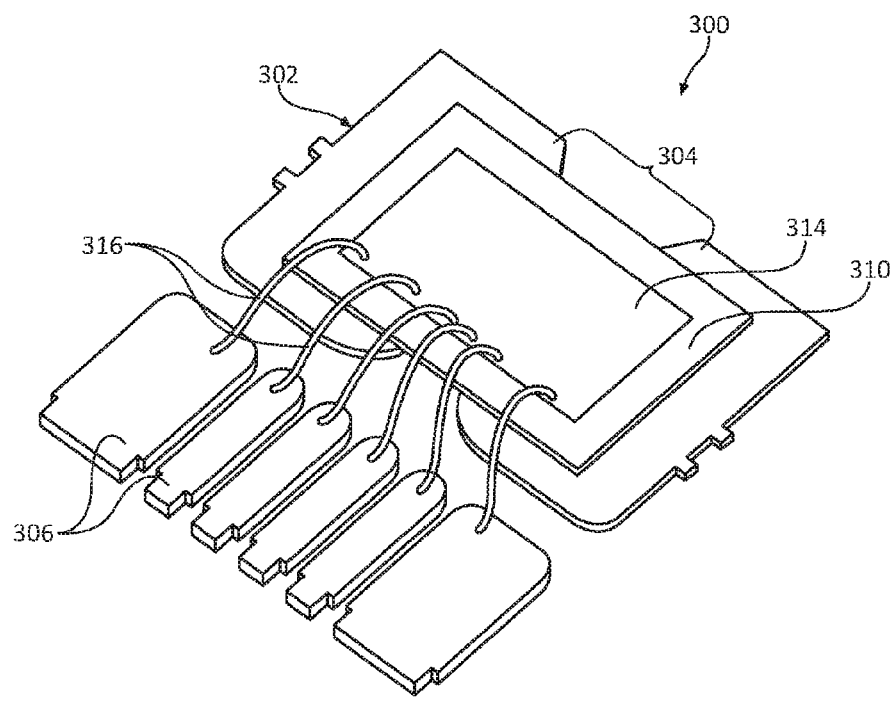
FIG. 4A is a perspective view illustrating one example of a current sensor with the encapsulation material removed and FIG. 4B is a cross-sectional view illustrating the current sensor.
Figure 4B:
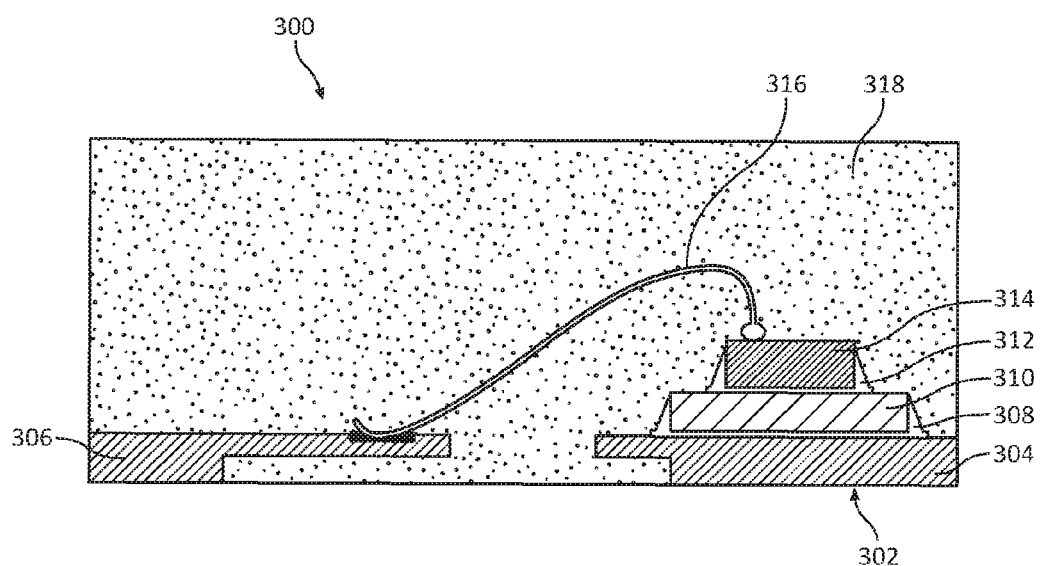

FIG. 4A is a perspective view illustrating one example of a current sensor 300 with encapsulation material removed. FIG. 4B is a cross-sectional view illustrating current sensor 300. Current sensor 300 includes a leadframe 302, a first antistatic die attach material 308, an isolator 310, a second antistatic die attach material 312, a semiconductor die 314, bond wires 316, and encapsulation material 318. Leadframe 302 includes a current rail 304 and leads 306.

First antistatic die attach material 308 is on the upper surface of current rail 304. Isolator 310 is on first antistatic die attach material 308 to attach isolator 310 to current rail 304. Second antistatic die attach material 312 is on the upper surface of isolator 310. Semiconductor die 314 is on second antistatic die attach material 312 to attach semiconductor die 314 to isolator 310. Contacts on the upper surface of semiconductor die 314 are electrically coupled to corresponding leads 306 via bond wires 316. Encapsulation material 318 encapsulates bond wires 316, semiconductor die 314, second antistatic die attach material 312, isolator 310, first antistatic die attach material 308, and portions of leadframe 302. At least portions of the bottom surface of leadframe 302 remain exposed to allow electrical connections to leads 306 and current rail 302.

Leadframe 302 may include a metal, such as Cu, Al, or other suitable metal. Isolator 310 may include glass, ceramic, bulk silicon, or other suitable insulating material. Semiconductor die 314 includes a magnetic field sensor to sense a current through current rail 304. First antistatic die attach material 308 and second antistatic die attach material 312 is similar to antistatic die attach material 104 previously described with reference to FIG. 1.

In operation, a high potential (e.g., up to 1500V) may be applied to current rail 304 while a low potential (e.g., 0V to 5V) may be applied to leads 306 and thereby to semiconductor die 314. Isolator 310 and antistatic die attach material 308 and 312 provide galvanic isolation between semiconductor die 314 and current rail 304. Antistatic die attach material 308 and 312 prevents localized electric fields within voids of the antistatic die attach material as previously described and illustrated with reference to FIG. 3. Thus, the partial discharge resistance of current sensor 300 is not adversely affected by voids within antistatic die attach material 308 and 312.

Figure 5:
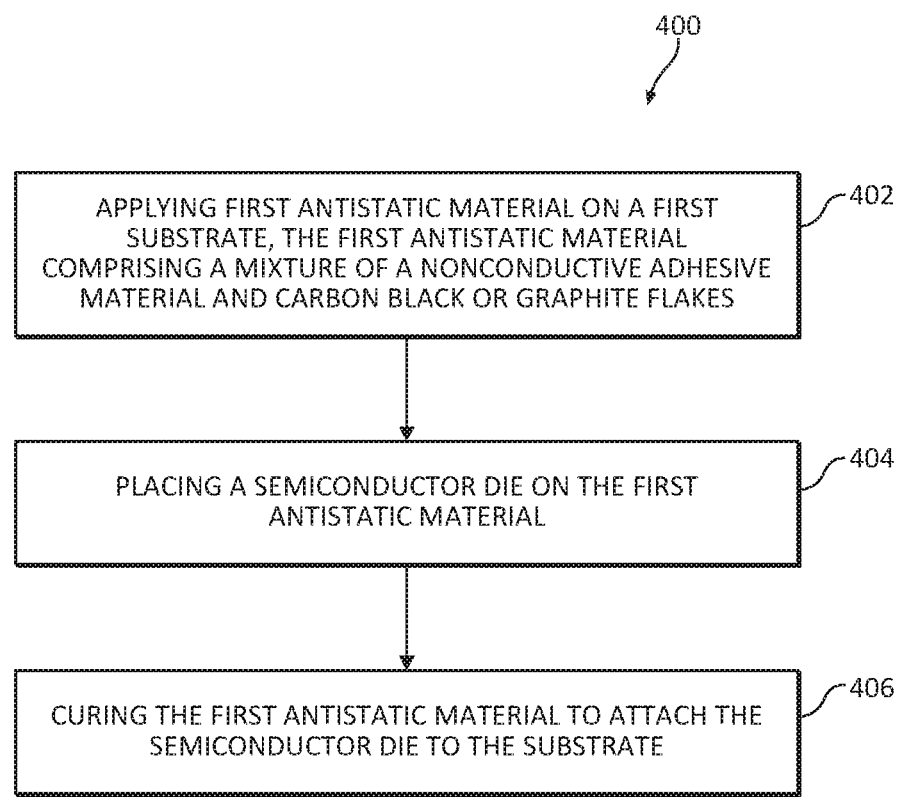
FIG. 5 is a flow diagram illustrating one example of a method for fabricating a semiconductor device including an antistatic die attach material.

FIG. 5 is a flow diagram illustrating one example of a method 400 for fabricating a semiconductor device including an antistatic die attach material. At 402, method 400 includes applying first antistatic material on a first substrate, the first antistatic material comprising a mixture of a nonconductive adhesive material and carbon black or graphite flakes. At 404, method 400 includes placing a semiconductor die on the first antistatic material. At 406, method 400 includes curing the first antistatic material to attach the semiconductor die to the substrate. In one example, method 400 includes mixing the nonconductive adhesive material with the carbon black or graphite flakes to provide the first antistatic material having a resistivity between $10^1$ $\Omega$·cm and $10^{10}$ $\Omega$·cm. In another example, method 400 includes mixing the nonconductive adhesive material with between 1% and 20% by weight of the carbon black or graphite flakes to provide the first antistatic material, such as between 1% and 10% by weight or between 1% and 2% by weight.

The first substrate may include an isolating substrate and method 400 may further include applying second antistatic material on a second substrate comprising a conductive material. The second antistatic material comprises a mixture of a nonconductive adhesive material and carbon black or graphite flakes. The first substrate may be placed on the second antistatic material and the second antistatic material may be cured to attach the first substrate to the second substrate.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A semiconductor device comprising:
   a substrate comprising a conductive material;
   an isolator;
   a semiconductor die;
   a first antistatic die attach material between the substrate and the isolator; and
   a second antistatic die attach material between the isolator and the semiconductor die,
   wherein the first and second antistatic die attach material comprises a mixture of a nonconductive adhesive material and carbon black or graphite flakes.

2. The semiconductor device of claim 1, wherein the first and second antistatic die attach material has a resistivity between $10^1$ Ω·cm and $10^{10}$ Ω·cm.

3. The semiconductor device of claim 1, wherein the first and second antistatic die attach material comprises between 1% and 10% by weight of carbon black or graphite flakes.

4. The semiconductor device of claim 1, wherein the substrate comprises a leadframe.

5. The semiconductor device of claim 1, wherein the nonconductive adhesive material comprises an epoxy.

6. The semiconductor device of claim 1, wherein the first and second antistatic die attach material comprise a die attach film.

7. The semiconductor device of claim 1, wherein the semiconductor die comprises a magnetic field sensor to sense a current through the substrate.

8. The semiconductor device of claim 1, wherein the isolator comprises glass, bulk silicon, or ceramic.

9. A method for fabricating a semiconductor device, the method comprising:
   applying first antistatic material on a first substrate, the first antistatic material comprising a mixture of a nonconductive adhesive material and carbon black or graphite flakes; and
   placing a semiconductor die on the first antistatic material;
   curing the first antistatic material to attach the semiconductor die to the substrate; and
   wherein the first substrate comprises an isolating substrate, the method further comprising:
   applying second antistatic material on a second substrate comprising a conductive material, the second antistatic material comprising a mixture of a nonconductive adhesive material and carbon black or graphite flakes;
   placing the first substrate on the second antistatic material; and
   curing the second antistatic material to attach the first substrate to the second substrate.

10. The method of claim 9, further comprising:
    mixing the nonconductive adhesive material with the carbon black or graphite flakes to provide the first antistatic material having a resistivity between $10^1$ Ω·cm and $10^{10}$ Ω·cm.

11. The method of claim 9, further comprising:
    mixing the nonconductive adhesive material with between 1% and 2% by weight of the carbon black or graphite flakes to provide the first antistatic material.

* * * * *